(12) United States Patent
Paranjpe et al.

(10) Patent No.: US 6,376,372 B1
(45) Date of Patent: Apr. 23, 2002

(54) APPROACHES FOR MITIGATING THE NARROW POLY-LINE EFFECT IN SILICIDE FORMATION

(75) Inventors: Ajit Pramod Paranjpe, Plano; Pushkar Prabhakar Apte, Dallas, both of TX (US); Mehrdad M. Moslehi, Los Alto, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/459,203

(22) Filed: Jun. 2, 1995

(51) Int. Cl.[7] ................ H01L 21/3205; H01L 21/44; H01L 21/302

(52) U.S. Cl. .............. 438/682; 438/592; 438/659; 438/660; 438/664; 438/683; 438/684; 438/745

(58) Field of Search .................... 437/24, 160, 192, 437/193, 200

(56) References Cited

U.S. PATENT DOCUMENTS

| 4,835,112 A | * | 5/1989 | Pfiester et al. | 437/200 |
| 4,877,748 A | * | 10/1989 | Havemann | 437/160 |
| 5,346,836 A | * | 9/1994 | Manning et al. | 437/200 |
| 5,401,674 A | * | 3/1995 | Anjum et al. | 437/190 |
| 5,470,794 A | * | 11/1995 | Anjum et al. | 437/24 |
| 5,508,212 A | * | 4/1996 | Wang et al. | 437/24 |

OTHER PUBLICATIONS

S. Wolf "Silicon Processing for the VLSI Era, vol. 2", Lattice Press, 1990, pp. 144–148.*

* cited by examiner

*Primary Examiner*—Ha Tran Nguyen
(74) *Attorney, Agent, or Firm*—Carlton H. Hoel; W. James Brady; Frederick J. Telecky, Jr.

(57) ABSTRACT

A silicide process using a pre-anneal amorphization implant prior to silicide anneal. A layer of titanium is deposited and reacted to form titanium silicide (32) and titanium nitride. The titanium nitride is removed and a pre-anneal amorphization implant is performed to enable increased transformation of the silicide (32) from a higher resistivity phase to a lower resistivity phase. A heavy dopant species (40) is used for the pre-anneal amorphization implant such as arsenic, antimony, or germanium. After the implant, the silicide anneal is performed to accomplish the transformation. An advantage of the invention is providing a silicide process having reduced silicide sheet resistance for narrow polysilicon lines.

19 Claims, 1 Drawing Sheet

APPROACHES FOR MITIGATING THE NARROW POLY-LINE EFFECT IN SILICIDE FORMATION

FIELD OF THE INVENTION

This invention generally relates to semiconductor processing and more specifically to silicide formation on narrow polysilicon lines.

BACKGROUND OF THE INVENTION

A typical silicide process consists of three steps: a silicide react step, a TiN (titanium nitride) strip, and a silicide anneal. During the react step, a refractory metal (e.g., titanium) is reacted in a $N_2$ (nitrogen) ambient to form silicide where the titanium reacts with silicon, and forms TiN elsewhere. The silicide formed during the react step is typically present as the higher resistivity phase known as C49. The TiN strip step removes the TiN layer formed during the react step. The anneal step is then used to transform the high silicide resistivity C49 phase into a lower silicide resistivity phase known as C54.

Silicide cladding of the polysilicon gate and the source/drain regions in VLSI (very large scale integrated) circuits using titanium silicide is a popular approach for reducing the transistor series resistance and local interconnect delays in VLSI circuits. The sheet resistance of heavily doped, silicided polysilicon lines is known to be a function of linewidth, particularly for sub-micron linewidths. One explanation for this is that a lower percentage of the silicide transforms from the higher resistivity C49 phase to the lower resistivity C54 phase on sub-0.5 μm polysilicon lines. Current sheet resistances for linewidths under 0.5 μm are particularly problematic. Hence, there is a need to alleviate this problem and reduce the dependence of the silicide sheet resistance on linewidth.

Several methods have been used to reduce the silicide sheet resistance. One method of reducing the silicide sheet resistance is to increase the temperature of the anneal. However, higher temperature leads to agglomeration of the silicide. Higher temperature also leads to lateral overgrowth of the silicide which is unacceptable for self-aligned silicide processing. Lateral overgrowth results in undesirable conductive silicide stringers between the polysilicon gate and the source/drain region of MOS transistors. Therefore, only minimal advances may be made by increasing temperature.

Another approach is to use a pre-react amorphization implant either prior to the titanium deposition or just after it, but in either case, before the silicide react step. This implant breaks the bonds of the polysilicon. The broken bonds yield an increased number of reaction sites for the silicide react and enhance the diffusion of silicon toward the growing silicide. This accelerates the silicide formation and thus reduces the silicide sheet resistance. However, even further reduction in silicide sheet resistance is needed.

SUMMARY OF THE INVENTION

A silicide process using a pre-anneal amorphization implant prior to silicide anneal is disclosed herein. A layer of titanium is deposited and reacted to form titanium silicide and titanium nitride. The titanium nitride is removed and a pre-anneal amorphization implant is performed to enable increased transformation of the silicide from a higher resistivity phase to a lower resistivity phase. After the implant, the silicide anneal is performed to accomplish to transformation. An advantage of the invention is providing a silicide process having reduced silicide sheet resistance for narrow polysilicon lines.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
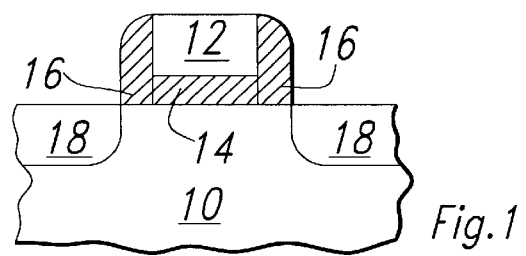
FIG. 1 is a cross-sectional view of a semiconductor body upon which the silicide process according to the invention may be performed.

The invention is an improved silicide process providing reduced sheet resistance for narrow, silicided polysilicon lines. The invention is particularly suited for sub-0.5 μm polysilicon lines and may be combined with other approaches to further reduce the silicide sheet resistance. FIG. 1 illustrates a typical semiconductor body 10 for which silicide processing is desired. Semiconductor body 10 is shown processed through source/drain anneal. A polysilicon gate 12 is separated from semiconductor body 10 by gate oxide 14. Sidewall dielectric 16 is located on the sidewalls of polysilicon gate 12. Source/drain regions 18 in semiconductor body 10 lie adjacent to polysilicon gate 12. The silicide process according to the invention performed on the structure of FIG. 1 will now be described.

Figure 2:
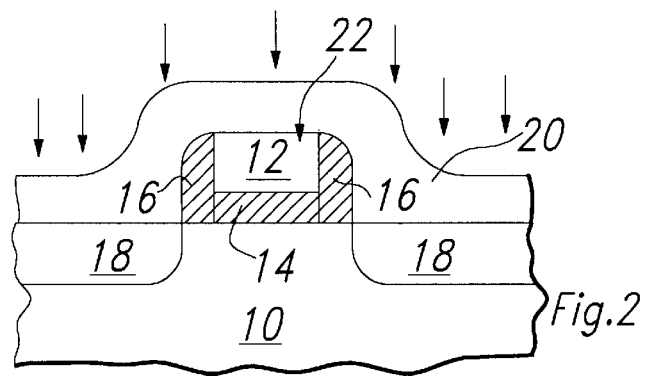
FIGS. 2–5 are cross-sectional view of the semiconductor body of FIG. 1 at various stages of the silicide process according to the invention.

A layer of titanium 20 is deposited over the structure as shown in FIG. 2 to a thickness on the order of 500 Å. For example, sputter-deposition at a temperature on the order of 250–450° C. may be used to deposit titanium layer 20. If desired, a pre-react amorphization implant may be performed after titanium layer 20 has been deposited, as illustrated in FIG. 2, or just prior to the deposition of titanium layer 20. In either case, the pre-react amorphization implant is optional and need not be performed to accomplish the invention.

A pre-react amorphization implant before titanium deposition breaks up grain boundaries and amorphizes/damages the surface region of the polysilicon. A pre-react amorphization implant immediately after titanium deposition additionally leads to some intermixing of the titanium and polysilicon at the interface, leading to a smoother silicide surface. The amorphized region 22 has broken silicon-silicon bonds. Thus, silicide formation in a subsequent silicide react step may be accelerated due to the increased number of reaction sites and due to enhanced diffusion of the silicon towards the growing silicide.

The implant dose and energy of the pre-react amorphization implant are selected so that the damaged region lies entirely within the polysilicon that is consumed during the subsequent silicide react step. If the damaged region extends too far into the substrate and approaches the vicinity of the source/drain region, transistor characteristics such as off-current and the drain to source breakdown voltage are degraded. Therefore, heavy species such as arsenic, antimony, and germanium are preferable for amorphizing the substrate because they produce shallow implants and a more uniform damage distribution. For example, arsenic may be implanted at $2.0 \times 10^{14}/cm^2$ at 50 keV. Heavier implant species are prevented from traveling too deeply into the surface primarily by nuclear stopping for which the energy loss/unit distance is relatively independent of ion energy. For these species, the amorphized region typically extends $1.5R_p$, while the heavily damaged region extends $2R_p$ into the substrate from the surface, where $R_p$ is the projected range of the implant. The minimum dose required for amorphizing a silicon substrate is approximately $10^{21}$ keV/cm$^3$. Damage due to implant by heavier species is also relatively easily annealed out during subsequent high temperature steps such as silicide react and anneal that are performed at temperatures above 400–600° C.

Figure 3:
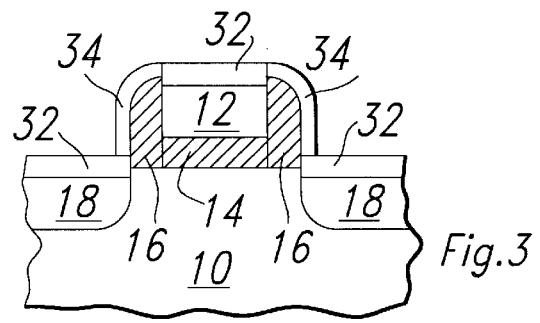
Figure 4:
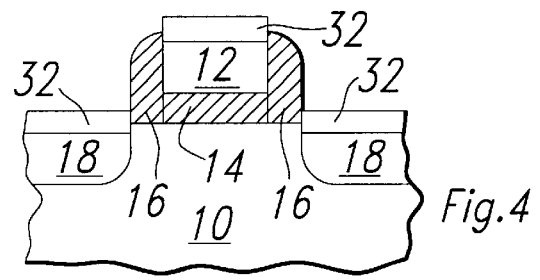

Next, silicide layer 32 is formed by reacting titanium layer 20 in a nitrogen-containing ambient as shown in FIG. 3. Silicide layer 32 forms over exposed silicon (i.e., source/drain regions 18 and polysilicon gate 12) and TiN layer 34 forms elsewhere from the reaction of titanium layer 20 with the nitrogen ambient. It should be noted that TiN may also form over portions of silicide layer 32. Conventional techniques may be used to accomplish the silicide react step. For example, a rapid thermal processor may be used to perform the silicide react step in a nitrogen ambient at a temperature on the order of 695° C. for a duration on the order of 60 seconds. Temperatures in excess of 600° C. are desirable since the high temperature of the silicide react step aids in annealing out the damage caused by the pre-react amorphization implant. However, temperatures should remain below 950° C. to prevent agglomeration of the silicide. After the silicide react step, a TiN strip is performed to remove TiN layer 34 as shown in FIG. 4. As an example, the TiN strip may comprise a megasonic bath in ammonium-hydroxide and water (NH4OH:H2O2:H2O) for a duration on the order of 30 minutes.

Figure 5:
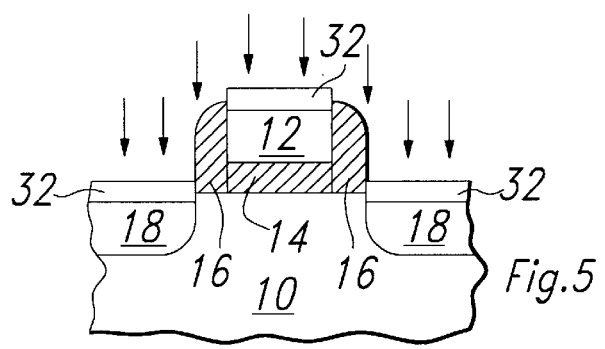

After the silicide formation and TiN strip, a pre-anneal amorphization implant is performed, as shown in FIG. 5. The pre-anneal amorphization implant is also a low dose, low energy implant. As with the pre-react amorphization implant, heavy species 40 such as arsenic, antimony and germanium are preferred. For example, arsenic may be implanted at $2.0\times10^{14}$/cm$^2$ at 50 keV. The energy from the implant of massive ions is dissipated in the silicide and amorphizes (i.e., breaks the bonds of) the silicide. Amorphization of the silicide increases the driving force of the phase transformation from the higher resistivity C49 phase to lower resistivity C54 phase that occurs during the subsequent silicide anneal. The pre-anneal amorphization implant introduces many point-defects in the silicide. This, in turn, increases the number of nucleation sites available for phase transformation to be initiated. The region damaged by the pre-anneal amorphization implant will be annealed out during the subsequent silicide anneal.

After the pre-anneal amorphization implant, a silicide anneal is performed. Higher temperatures are used for the silicide anneal than for the silicide react step. Temperatures approaching that used for the source/drain and gate anneal processes (e.g., on the order of 850–900° C.) are desirable. One exemplary anneal is an anneal at 850° C. for 30 seconds. The silicide anneal repairs damage that occurs from both the pre-react and pre-anneal amorphization implants, provided the temperature of the anneal is in excess of 600° C. (Temperatures should however, remain below that which would cause agglomeration of the silicide layer 32.) Thus, the pre-amorphization implants are not expected to have any deleterious effects on transistor performance, such as those that have been observed in prior art methods.

The silicide anneal transforms the silicide layer 32 from a higher resistivity C49 phase to a lower resistivity C54 phase. In prior art silicide processes, it is believed that a lower percentage of the silicide transforms to the low resistivity C54 phase in sub-0.5 µm polysilicon lines. However, due to the pre-anneal amorphization implant of the present invention, a higher percentage of the silicide transforms to the lower C54 phase. Thus, a low sheet resistance is obtained even for narrow polysilicon lines (i.e, sub-0.5 µm width).

At the completion of the silicide processing described above, device fabrication may continue as is known in the art. For example, an interlevel dielectric layer may be formed with contacts extending therethrough to connect to various portions of silicide layer 32. This may be followed by forming a multi-level metal interconnect for interconnecting various devices of semiconductor body 10.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the invention may be used in conjunction with other approaches that reduce sheet resistance to obtain low sheet resistance, silicided polysilicon lines. It is therefore intended that the appended claims encompass any such modifications or embodiments.

What is claimed is:

1. A silicide process for a polysilicon line, comprising the steps of:
   providing a semiconductor body having the polysilicon line formed thereon and source/drain regions formed therein;
   depositing a layer of titanium over said polysilicon line;
   reacting said layer of titanium with said polysilicon line to create a silicide layer;
   performing a pre-anneal amorphization implant into said silicide layer after said reacting step; and
   annealing said silicide layer at a temperature greater than 600° C. after said pre-anneal amorphization implant step.

2. The silicide process of claim 1, wherein said performing a pre-anneal amorphization implant step comprises the step of implanting a species selected from the group consisting of arsenic, antimony, and germanium.

3. The silicide process of claim 1, wherein said performing a pre-anneal amorphization implant step comprises the step of implanting a species at an energy on the order of 50 keV.

4. The silicide process of claim 1, wherein said performing a pre-anneal amorphization implant step comprises the step of implanting a species at a dose on the order of $2.0\times10^{14}$/cm$^2$.

5. The silicide process of claim 1, wherein said polysilicon line has a sub-0.5 µm width.

6. The silicide process of claim 1 wherein said reacting step is performed at a temperature on the order of 695° C.

7. The silicide process of claim 1, further comprising the step of performing a pre-react amorphization implant after said depositing step and prior to said reacting step.

8. The silicide process of claim 7, wherein said step of performing a prereact amorphization implant comprises the step of implanting a dopant species at a dose on the order of $2.0\times10^{14}$/cm$^2$ and an energy on the order of 50 keV.

9. The silicide process of claim 8, wherein said dopant species is selected from the group consisting of arsenic, antimony, and germanium.

10. The silicide process of claim 1, wherein said anneal step transforms said silicide layer from a higher resistivity phase to a lower resistivity phase and wherein said pre-anneal amorphization implant step increases the percentage of silicide transformed to said lower resistivity phase.

11. A silicide process for a semiconductor body having a polysilicon gate and source/drain regions, comprising the steps of:

depositing a layer of titanium over said polysilicon gate and said source/drain regions;

reacting said layer of titanium with said polysilicon gate and said source/drain regions in a nitrogen-containing ambient to create a silicide layer and a layer of titanium nitride;

stripping said layer of titanium nitride;

performing a pre-anneal amorphization implant into said silicide layer after said stripping step; and annealing said silicide layer at a temperature on the order of 850° C. after said pre-anneal amorphization implant step.

12. The silicide process of claim 11, wherein the step of performing a pre-anneal amorphization implant comprises implanting a species selected from the group consisting of arsenic, antimony, and germanium.

13. The silicide process of claim 11, wherein said performing a pre-anneal amorphization implant step comprises the step of implanting a species at an energy on the order of 50 keV and a dose on the order of $2.0 \times 10^{14}/\text{cm}^2$.

14. The silicide process of claim 11, further comprising the step of performing a pre-react amorphization implant prior to said reacting step.

15. The silicide process of claim 14, wherein said step of performing a pre-react amorphization implant comprises the step of implanting a dopant species at a dose on the order of $2.0 \times 10^{14}/\text{cm}^2$ and an energy on the order of 50 keV.

16. The silicide process of claim 15, wherein said dopant species is selected from the group consisting of arsenic, antimony, and germanium.

17. The silicide process of claim 14, wherein said step of performing said pre-react amorphization implant step occurs after said depositing step.

18. The silicide process of claim 11, wherein said anneal step transforms said silicide layer from a higher resistivity phase to a lower resistivity phase and wherein said pre-annealpre-amorphization implant step increases the percentage of silicide transformed to said lower resistivity phase.

19. A silicide process for a polysilicon line, comprising the steps of:

depositing a layer of titanium over said polysilicon line;

performing a pre-react amorphization implant into said layer of titanium;

reacting said layer of titanium with said polysilicon line to create a silicide layer;

performing a pre-anneal amorphization implant into said silicide layer after said reacting step; and annealing said silicide layer at a temperature greater than 600° C. after said pre-anneal amorphization implant step.

* * * * *